United States Patent [19]
Jeon et al.

[11] Patent Number: 6,100,826
[45] Date of Patent: Aug. 8, 2000

[54] SYMBOL DECODING METHOD AND APPARATUS

[75] Inventors: Byeungwoo Jeon, Sungnam; Kuen-Pyo Hong, Suwon; Jae-Nam Noh, Sungnam; Jong-Won Lee, Suwon, all of Rep. of Korea

[73] Assignee: Samsung Electronics Co., Ltd., Kyungki-Do, Rep. of Korea

[21] Appl. No.: 09/054,402

[22] Filed: Apr. 3, 1998

[30] Foreign Application Priority Data

| Apr. 4, 1997 | [KR] | Rep. of Korea | 97-12536 |
| Apr. 4, 1997 | [KR] | Rep. of Korea | 97-12537 |
| Apr. 4, 1997 | [KR] | Rep. of Korea | 97-12538 |

[51] Int. Cl.$^7$ .................................................. H03M 7/40
[52] U.S. Cl. .................... 341/67; 341/65; 341/59
[58] Field of Search .................... 341/67, 65, 59

[56] References Cited

U.S. PATENT DOCUMENTS

| 5,706,001 | 1/1998 | Sohn | 341/63 |
| 5,757,969 | 5/1998 | Kim | 382/236 |
| 5,844,614 | 12/1998 | Chong et al. | 348/420 |
| 5,852,682 | 12/1998 | Kim | 382/268 |

*Primary Examiner*—Brian Young
*Assistant Examiner*—Jason L. W. Kost
*Attorney, Agent, or Firm*—Sughrue, Mion, Zinn, Macpeak & Seas, PLLC

[57] ABSTRACT

A symbol decoding apparatus run-level-decodes corresponding symbol data using the same scan pattern data as used for run-level-encoding. A symbol separator separates the received run-level-encoded symbol data into run data and level data. An address outputter selects a particular scan pattern using the scan pattern data associated with the symbol data, and selects a scan address for storing the level data among the scan addresses corresponding to the selected scan pattern using the separated run data. A data store stores the level data supplied from the symbol separator at the storage position designated by the selected scan address. Thus, the run-level-encoded symbols are run-level-decoded based on the scan pattern used for run-level encoding and stored in a form appropriate for use in a downstream unit.

35 Claims, 8 Drawing Sheets

FIG. 3A

| 1 | 2 | 6 | 7 | 15 | 16 | 28 | 29 |
|---|---|---|---|----|----|----|----|
| 3 | 5 | 8 | 14 | 17 | 27 | 30 | 43 |
| 4 | 9 | 13 | 18 | 26 | 31 | 42 | 44 |
| 10 | 12 | 19 | 25 | 32 | 41 | 45 | 54 |
| 11 | 20 | 24 | 33 | 40 | 46 | 53 | 55 |
| 21 | 23 | 34 | 39 | 47 | 52 | 56 | 61 |
| 22 | 35 | 38 | 48 | 51 | 57 | 60 | 62 |
| 36 | 37 | 49 | 50 | 58 | 59 | 63 | 64 |

ZIGZAG SCAN

FIG. 3B

| 1 | 5 | 7 | 21 | 23 | 37 | 39 | 53 |
|---|---|---|----|----|----|----|----|
| 2 | 6 | 8 | 22 | 24 | 38 | 40 | 54 |
| 3 | 9 | 20 | 25 | 35 | 41 | 51 | 55 |
| 4 | 10 | 19 | 26 | 36 | 42 | 52 | 56 |
| 11 | 18 | 27 | 31 | 43 | 47 | 57 | 61 |
| 12 | 17 | 28 | 32 | 44 | 48 | 58 | 62 |
| 13 | 16 | 29 | 33 | 45 | 49 | 59 | 63 |
| 14 | 15 | 30 | 34 | 46 | 50 | 60 | 64 |

ALTERNATE SCAN

FIG. 4

| SCAN PLACE | ADDRESS OFFSET | |
|---|---|---|
| | ZIGZAG SCAN | ALTERNATE SCAN |
| 1 | 0 | 0 |
| 2 | 1 | 8 |
| 3 | 8 | 16 |
| 4 | 16 | 24 |
| 5 | 9 | 1 |
| 6 | 2 | 9 |
| 7 | 3 | 2 |
| 8 | 10 | 10 |
| 9 | 17 | 17 |
| 10 | 24 | 25 |
| ... | ... | ... |

FIG. 6A  CLOCK
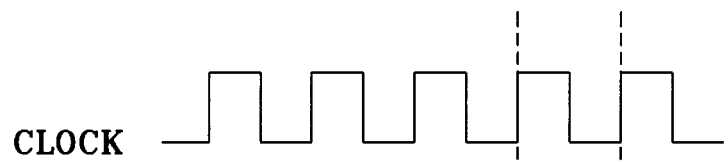
FIG. 6B  ENABLE
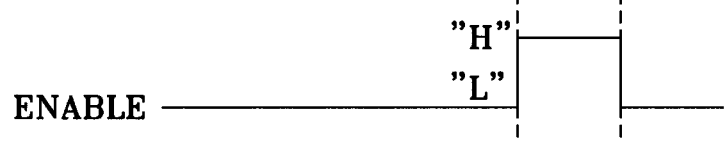
FIG. 6C  LEVEL
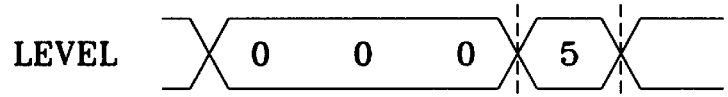
FIG. 6D  ADDR
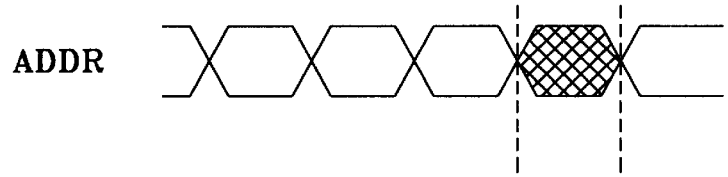

SYMBOL DECODING METHOD AND APPARATUS

BACKGROUND OF THE INVENTION

Field of the Invention

The present invention relates to a decoding system for decoding variable-length-encoded data, and more particularly, to a method and apparatus for decoding run-level-encoded symbols using a scan pattern selected from various scan patterns.

Recently, various methods for encoding image and audio signals into digital data so as to be transmitted or stored in a storing medium, and decoding the encoded digital data in order to be reproduced, have been used in a system for transmitting and receiving image and audio signals. However, there is needed a technique for further reducing the quantity of transmission data in order to enhance data transmission efficiency in the encoding and decoding system. There have been a transformation encoding method, a differential pulse code modulation (DPCM) method, a vector quantization method, and a variable-length-coding method, etc., as methods for coding the digital data to be transmitted or stored. The encoding methods remove redundant data contained in the digital data to be transmitted or stored, to further reduce a total quantity of data.

The image data of each frame is divided into blocks of a predetermined size, and data-processed in an encoding and decoding system in order to store, transmit or receive the image signals. Each block data or differential data between block data is orthogonal-transformed, so that the image data is transformed into transformation coefficients in a frequency domain. There have been discrete cosine transform (DCT), Walsh-Hadamard transform (WHT), discrete Fourier transform (DFT), and discrete sine transform (DST), etc., as well-known block data transformation methods. The transformation coefficients obtained by these transformation methods are properly quantized and variable length-encoded according to the characteristics of coefficient data, so that compression efficiency is increased. Since human visual perception is more sensitive to low frequency than high frequency, the high-frequency component data is reduced by data processing. Accordingly, the quantity of the encoded data can be decreased.

The apparatus for variable-length-coding compresses data based on the probability of occurrence of the symbols, and includes a variable-length-coding table for variable-length-encoding input symbols. The variable-length-coding table is designed according to the Huffman coding technique. As is well known, the Huffman coding allocates different codes which vary in length according to the probabilities of occurrence of predetermined symbols. That is, the higher the probability is, the shorter the code which is allocated, and the lower the probability is, the longer the code which is allocated.

In the existing encoding system, the symbols input to the variable-length-coding apparatus are [run, level] symbols obtained via run-level-coding. In the case of the MPEG standard of image standardization, image data divided into blocks each having an 8×8 pixel size is transformed into data in the frequency domain and then quantized. The quantized transformation coefficients are expressed in a two-dimensional frequency domain of an 8×8 size, and encoded into [run, level] symbols by a well-known zigzag scan for scanning from low frequency to high frequency in the two-dimensional frequency domain. Here, the "run" means the number of times of occurrence of zero between coefficients not "0", and the "level" means an absolute value of a coefficient not "0". In the case of a frequency domain of an 8×8 size, the run can have values from "0" to "63". In the case that the quantized transformation coefficients are an integer value from −255 to 255, the level can have values from 1 to 255, and the sign is separately indicated.

The use of a zigzag scan pattern is due to a phenomenon that energies of the image signal are concentrated at the low frequency domain centering around the DC component. However, the energy of the image signal can be more concentratively or more widely distributed to frequency components of a horizontal orientation or a vertical orientation according to the pattern of the image signal. Therefore, the existing zigzag scan pattern is not always the optimum scan pattern for variable-length-coding the image data. Thus, scan patterns which can be adaptably sloped to a horizontal orientation or a vertical orientation in the two-dimensional frequency domain according to distribution characteristics of the image data, are desirable for the variable-length encoding and decoding. The relevant prior art is disclosed in U.S. Pat. No. 5,497,153 entitled "Variable-Length Coding and Decoding System", which is assigned to the same assignee as that of the present invention.

According to the above prior art reference, the digital data divided into blocks each having a predetermined size is variable-length-encoded according to various scan patterns, the length of the variable-length-encoded data is accumulated in correspondence to each scan pattern, and then a scan pattern corresponding to the minimum accumulated length is selected. Both the selected scan pattern and the variable-length-encoded data corresponding to the selected scan pattern are transmitted. When decoding, the transmitted variable-length-encoded data is scanned according to the same scan pattern as selected when variable-length-encoding and is variable-length-decoded. Thus, a data compression efficiency is further enhanced by using an optimized scan pattern for variable-length-encoding and variable-length-decoding the block data. The variable-length-decoding apparatus disclosed in the above prior art will be described with reference to FIG. 1.

FIG. 1 shows an example of a conventional variable-length-decoding apparatus. Referring to FIG. 1, variable-length-encoded data $D_{VLC}$ and corresponding scan pattern data $D_{SCAN}$ transmitted from an encoding apparatus (not shown) are input to a variable-length-decoder 11 and a scan pattern selector 12, respectively. The variable-length-decoder 11 converts the input variable-length-encoded data $D_{VLC}$ into a [run, level] symbol according to a variable-length-decoding table. The scan pattern selector 12 which stores scan addresses according to various scan patterns of 1 through N in correspondence to each scan pattern, selects scan addresses ADDRs corresponding to the input scan pattern data $D_{SCAN}$ to output the selected result. A run-level-decoder 13 transforms the [run, level] symbols input from the variable-length-decoder 11 into quantization coefficients expressed in the two-dimensional spatial domain according to the corresponding scan addresses ADDRs input from the scan pattern selector 12. Then, the quantization coefficients are supplied to an inverse quantizer (not shown).

SUMMARY OF THE INVENTION

Therefore, it is one object of the present invention to provide a symbol decoding method for decoding run-level-encoded symbols according to the same scan pattern as selected in the process of run-level-encoding for every block of data.

It is another object of the present invention to provide a symbol decoding apparatus embodying the above-described symbol decoding method in hardware.

To accomplish the above object of the present invention, there is provided a symbol decoding method comprising the steps of:

receiving run-level-encoded symbol data and scan pattern data; and storing level data corresponding to the received symbol data as run-level-decoded data, according to a particular scan pattern selected from a plurality of scan patterns in response to the received scan pattern data.

The storage step can be varied into the step of storing both the run data RUN and the level data LEVEL corresponding to the received symbol data according to a particular scan pattern selected from a plurality of scan patterns in response to the received scan pattern data.

To accomplish another object of the present invention, there is provided a symbol decoding apparatus comprising:

a symbol separator for separating received run-level-encoded symbol data into run data and level data; and data storage means for storing the level data separated by the symbol separator as run-level-decoded data, at the storage positions designated by both the run data separated by the symbol separator and a particular scan pattern selected from a plurality of scan patterns in response to the scan pattern data corresponding to the symbol data.

There is also provided a symbol decoder for decoding received run-level-encoded symbol data and outputting data expressed by both zeros corresponding to a run length and a following level which follows the run length; and data storage means for storing the data output from the symbol decoder as run-level-decoded data, according to a particular scan pattern selected from a plurality of scan patterns in response to the scan pattern data corresponding to said symbol data.

BRIEF DESCRIPTION OF THE DRAWINGS

The preferred embodiments are described with reference to the drawing wherein:

FIG. 3A is a view for explaining a scan sequence according to a zigzag scan pattern;

FIG. 3B is a view for explaining a scan sequence according to an alternate scan pattern;

FIG. 4 shows a table of the scan addresses corresponding to the scan sequences described with reference to FIGS. 3A and 3B;

FIGS. 6A through 6D are timing diagrams for explaining the operation of the FIG. 5 apparatus;

DESCRIPTION OF THE PREFERRED EMBODIMENTS

Preferred embodiments of the present invention will be described with reference to the accompanying drawings.

Figure 2:
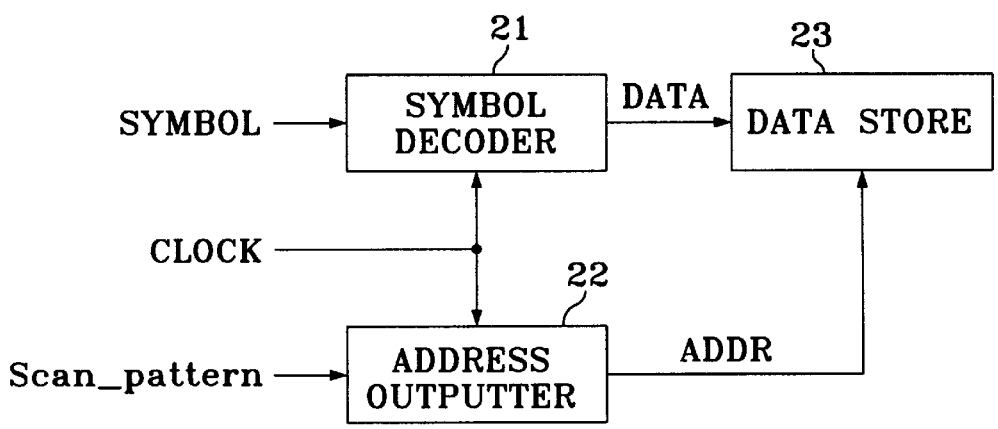
FIG. 2 is a block diagram showing a symbol decoding apparatus according to a preferred embodiment of the present invention.

Referring to FIG. 2 showing a symbol decoding apparatus according to a preferred embodiment of the present invention, a symbol decoder 21 outputs data including zeros of run length data and following level with respect to an input symbol, according to an input clock CLOCK. The data output from the symbol decoder 21 is stored in a data store 23. The data store 23 which includes 64 storage locations for storing the data, stores the data DATA supplied from the symbol decoder 21 at a storage location designated by a scan address ADDR supplied from an address outputter 22. The address outputter 22 provides the data store 23 with each of scan addresses corresponding to the scan pattern designated by the input scan pattern data Scan_pattern, in synchronization with each pulse of the input clock CLOCK. The address outputter 22 stores the scan addresses determined by a scan sequence of each of a plurality of scan patterns, in the form of a table. Therefore, in the case of two scan patterns as shown in FIGS. 3A and 3B, the address outputter 22 stores the scan addresses corresponding to each scan sequence of the zigzag scan pattern and the alternate scan pattern, in the form of a table shown in FIG. 4.

FIG. 4 shows a scan sequence and address offsets in an inter-coding mode with respect to a block of an 8×8 pixel size, which shows the address offsets from the initial scan address possessed by 64 scan addresses each having a scan sequence according to the zigzag scan pattern and the alternate scan pattern. In FIG. 4, a column indicated by the zigzag scan shows the address offsets according to the zigzag scan pattern shown in FIG. 3A, and a column indicated by the alternate scan shows the address offsets according to the alternate scan pattern shown in FIG. 3B.

The address offsets shown in FIG. 4 have scan places according to the zigzag scan pattern or alternate scan pattern. When the storage locations in the data store 23 have the sequence according to a raster scan pattern, an address offset coincides with the scan place value according to the raster scan pattern which is possessed by the storage location in the data store 23 designated by a scan address corresponding to the address offset. For better understanding, a scan place "5" shown in FIG. 3A is explained as an example. Assuming that an address offset corresponding to a storage location having a scan place "1" is "0," a storage location having a scan place "5" according to a zigzag scan pattern has an address offset whose value is "9", because the storage location has a scan place "10" according to a raster scan pattern.

In inter-coding mode, generation of the scan addresses for each block using the zigzag scan pattern or the alternate scan pattern starts from the scan place "1" having an address offset value "0". This is because the first data to be scanned is placed at the position of the DC component coefficient among DCT component coefficients, that is, the position indicated as "1" in FIG. 3A or 3B. On the other hand, in intra-coding mode, generation of the scan addresses for each block starts from the scan place "2" shown in FIG. 4, that is, the position indicated as "2" in FIG. 3A or 3B. This is due to the fact that in the case of the intra-coding mode, the DC component is separately transmitted and only the AC components are scanned, run-level-encoded and variable-length-encoded for transmission.

Figure 1:
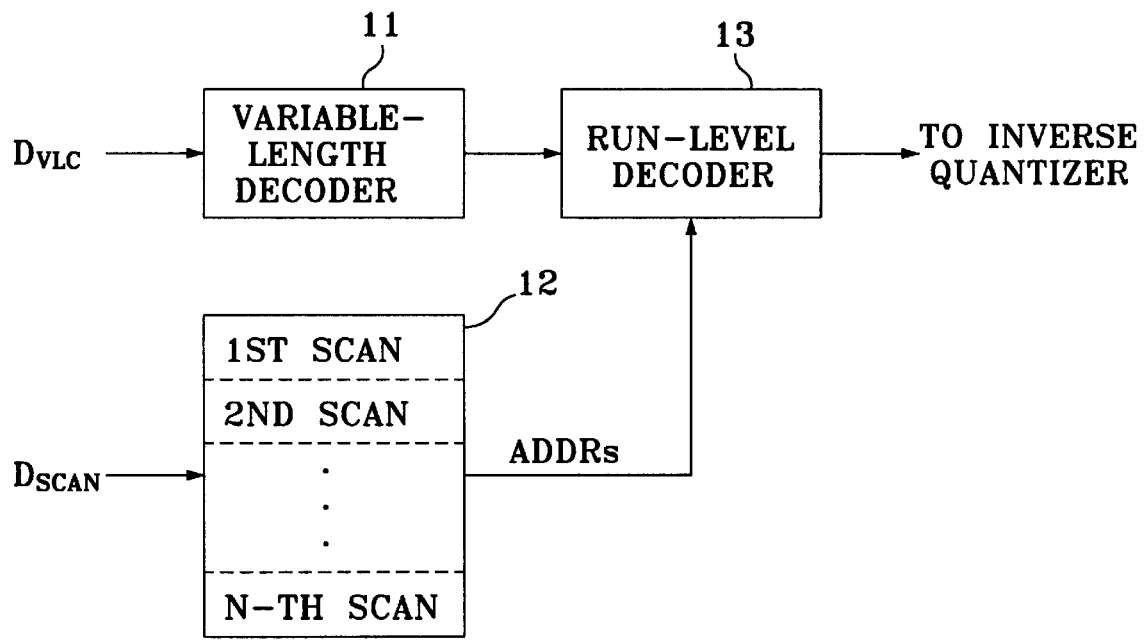
FIG. 1 is a block diagram showing an example of a conventional variable-length-decoding apparatus.

A symbol converted from the variable-length-encoded data by a variable-length-decoder (not shown) is data for expressing a pair of run and level, and is input to the symbol decoder 21. The scan pattern data Scan_pattern being identical to the scan pattern data $D_{SCAN}$ described with reference to FIG. 1 is input to the address outputter 22. Here, the scan pattern data Scan_pattern represents a scan pattern used for run-level encoding in an encoding apparatus (not shown). The symbol decoder 21 decodes the input symbol and generates a number of zeros corresponding to the run length and generates a level, and respectively synchronizes the generated zeros and level with each pulse of the clock CLOCK and outputs, in sequence, zeros and level synchronized with each pulse of the clock CLOCK to the data store 23. The address outputter 22 selects one of a plurality of scan patterns based on the received scan pattern data Scan_pattern, synchronizes each of scan addresses ADDR according to the selected scan pattern with an individual pulse of the same clock as that being supplied to the symbol decoder 21 and outputs the synchronized addresses. The data store 23 stores the individual data DATA supplied from the symbol decoder 21, that is, "zero" or "level" at the storage location designated by the scan address ADDR applied from the address outputter 22.

For example, when an input symbol represents a run of "3" and a level of "5" corresponding to an AC component coefficient in the intra-coding mode, the symbol decoder 21 decodes the input symbol, synchronizes three zeros corresponding to the run of "3" and the level of "5" with each pulse of the clock in its sequence, to then output the result. Then, the address outputter 22 synchronizes each of the scan addresses of the scan pattern designated by the input scan pattern data Scan_pattern with each pulse of the clock, to then output the result. When the zigzag scan pattern as shown in FIG. 3A is selected by the scan pattern data, the address outputter 22 respectively synchronizes the scan addresses "1," "8," "16" and "9" with each pulse of the clock in sequence and then outputs the synchronized result to the data store 23. On the other hand when the alternate scan pattern as shown in FIG. 3B is selected by the scan pattern data Scan_pattern, the address outputter 22 respectively synchronizes the scan addresses ADDR "8," "16," "24" and "1" with each pulse of the clock in sequence and then outputs the synchronized result to the data store 23. The data store 23 stores the data DATA received from the symbol decoder 21 at the storage position designated by the scan address ADDR output from the address outputter 22. The data store 23 stores the received data DATA in units of an 8×8 block, and outputs the stored data as run-level-decoded data to an inverse quantizer (not shown).

Thus, the FIG. 2 apparatus pre-stores the scan addresses corresponding to the scan sequence of various scan patterns when decoding the symbols, in the form of a table, and stores and outputs the run-level-decoded data in units of a block according to the scan addresses contained in the table of the same scan pattern as that used when variable-lengthen-coding, in synchronization with the clock.

Figure 5:
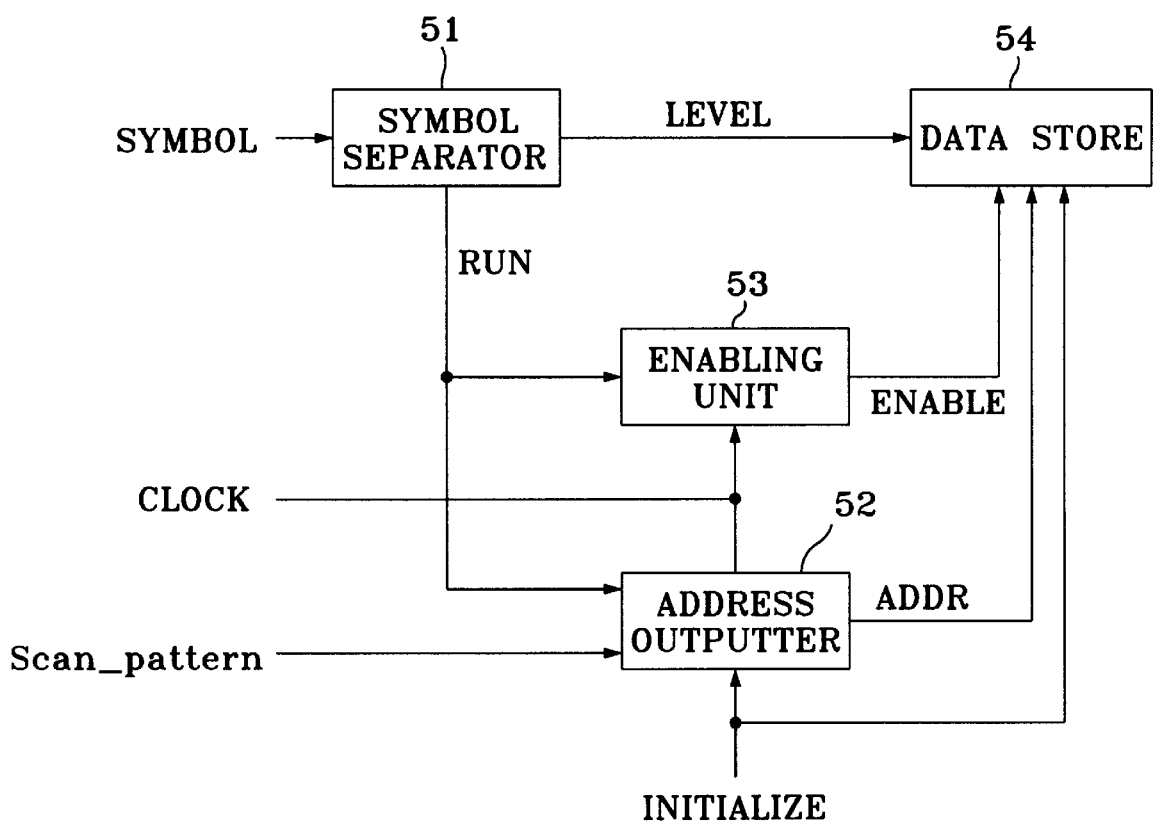
FIG. 5 is a block diagram showing a symbol decoding apparatus according to another embodiment of the present invention.

FIG. 5 is a block diagram showing a symbol decoding apparatus according to another embodiment of the present invention. The FIG. 5 apparatus decodes input symbols using the symbols each having a pair of run and level and the scan pattern data Scan_pattern corresponding to the symbols. As in the FIG. 2 apparatus, the symbols and the scan pattern data corresponding to the symbols are generated by a variable-length-decoder (not shown). Referring to FIG. 5, a symbol separator 51 separates received symbol into run data RUN and level data LEVEL. The symbol separator 51 supplies the separated run data RUN to an address outputter 52 and the level data LEVEL to a data store 54. The address outputter 52 includes a table storing scan addresses corresponding to each scan sequence of a plurality of scan patterns in correspondence to each scan pattern, as in the address outputter 22 of FIG. 2. In other words, the address outputter 52 stores the scan addresses corresponding to each scan sequence of a plurality of scan patterns including two scan patterns shown in FIGS. 3A and 3B, in the form of a table as shown in FIG. 4. However, differently from the address outputter 22 of FIG. 2, the address outputter 52 further receives run data RUN and an initialization signal INITIALIZE, in addition to the scan pattern data Scan_pattern and the clock CLOCK. The address outputter 52 generates a scan address ADDR based on the received signals. An enabling unit 53 receives the run data RUN and the clock CLOCK and generates an enable signal ENABLE based on the received run data RUN and the clock. As shown in FIG. 6B, with respect to a single symbol, the enable signal ENABLE has a low level during a period corresponding to the number of clock pulses coinciding with the run length, but has a high level after the period elapses. The enable signal generated in this manner is input to the data store 54. The data store 54 which receives the level data LEVEL from the symbol separator 51, the scan address ADDR from the address outputter 52 and the initialization signal INITIALIZE, resets all the is storage contents as "0" according to the initialization signal INITIALIZE applied before run-level decoding with respect to the symbols of each block starts, and then stores the level data LEVEL separated by the symbol separator 51.

The initialization signal INITIALIZE generated by a controller (not shown) is input to the address outputter 52 and the data store 54, prior to starting a run-level decoding with respect to the symbols of each block. Whenever the initialization signal INITIALIZE is input, the address outputter 52 initializes a current address pointer and the data store 54 resets all the storage contents as "0." In more detail, whenever the initialization signal INITIALIZE is input, the address outputter 52 selects one of a plurality of scan patterns according to the scan pattern data Scan_pattern corresponding to the scan pattern used for the run-level encoding in the encoding apparatus, and initializes the address pointer so that the first scan address among the scan addresses involved with the selected scan pattern is pointed out. Here, the first scan address is a scan address corresponding to a scan place "1" shown in FIG. 4 in case of an inter-coding mode, and is a scan address corresponding to a scan place "2" of FIG. 4 in case of an intra-coding mode. The data store 54 resets all memory cells constituting the data store 54 as "0" either simultaneously or in units of a row. Since a reset technique of the memory cells for initialization is known to a person skilled in the art, the description thereof will be omitted.

When a symbol is applied from the variable-length-decoder (not shown) at the state where the address pointer and the memory cells of the data store 54 have been initialized, the symbol separator 51 separates the received symbol into the run data RUN and the level data LEVEL. In the case when the symbol is constituted by a pair of a run value of "3" and a level value of "5" as shown in FIG. 6C, the symbol separator 51 separates the symbol into the run data RUN of "3" and the level data LEVEL of "5", and outputs the run data RUN of "3" to the address outputter 52 and the enabling unit 53 and the level data LEVEL of "5" to the data store 54, respectively. Preferably, the symbol separator 51 outputs the level data LEVEL at the point of time when the time corresponding to the run length of the run data RUN elapses with respect to the received individual symbol. The address outputter 52 outputs each ADDR of scan addresses involved with the scan pattern corresponding to the scan pattern data Scan_pattern input from an external source to the data store 54 in synchronization with each pulse of the input clock CLOCK. The address outputter 52 which receives the run data RUN determines a position of the address pointer of the corresponding level data LEVEL based on the selected scan pattern and received run data RUN, and outputs the scan address ADDR having the determined position to the data store 54 in synchronization with the clock of FIG. 6A. The enabling unit 53 receiving the same clock as input to the address outputter 52 receives the run data RUN of "3" and the clock as shown in FIG. 6A, generates an enable signal ENABLE as shown in FIG. 6B in order to control data storage operation of the data store 54, and supplies the generated enable signal ENABLE to the data store 54. In more detail, the enabling unit 53 outputs an enable signal ENABLE having a low level during a clock pulse period during the run length of the run data RUN and outputs an enable signal having a high level during a next one-clock pulse period. Therefore, the enable signal ENABLE of the high level is supplied from the enabling unit 53 to the data store 54 at the point in time when the data store 54 stores the level data LEVEL supplied from the symbol separator 51.

The data store 54 receiving the level data LEVEL output from the symbol separator 51 does not perform the storage operation with respect to the data supplied from the symbol separator 51 during the time when the enable signal ENABLE applied from the enabling unit 53 is at a low level, even if the scan address ADDR is applied from the address outputter 52. The data store 54 stores the level data LEVEL supplied from the symbol separator 51 at the storage position corresponding to a scan address ADDR output from the address outputter 52, during the time when the enable signal applied from the enabling unit 53 is at a high level. Therefore, in the case when the run data RUN is "3" and the level data LEVEL is "5" the data store 54, as shown in FIGS. 6A through 6D, stores the level data LEVEL of "5" at the storage location designated by a corresponding scan address ADDR, that is, a scan address shaded in FIG. 6D. The data store 54 has 64 memory cells as storage locations and outputs all the data contained in all storage locations, including the stored data involved with each block, to an inverse quantizer (not shown) as run-level-decoded data.

As a result, the FIG. 5 apparatus can perform a run-level decoding without storing zero or zeros by the run length.

Figure 7:
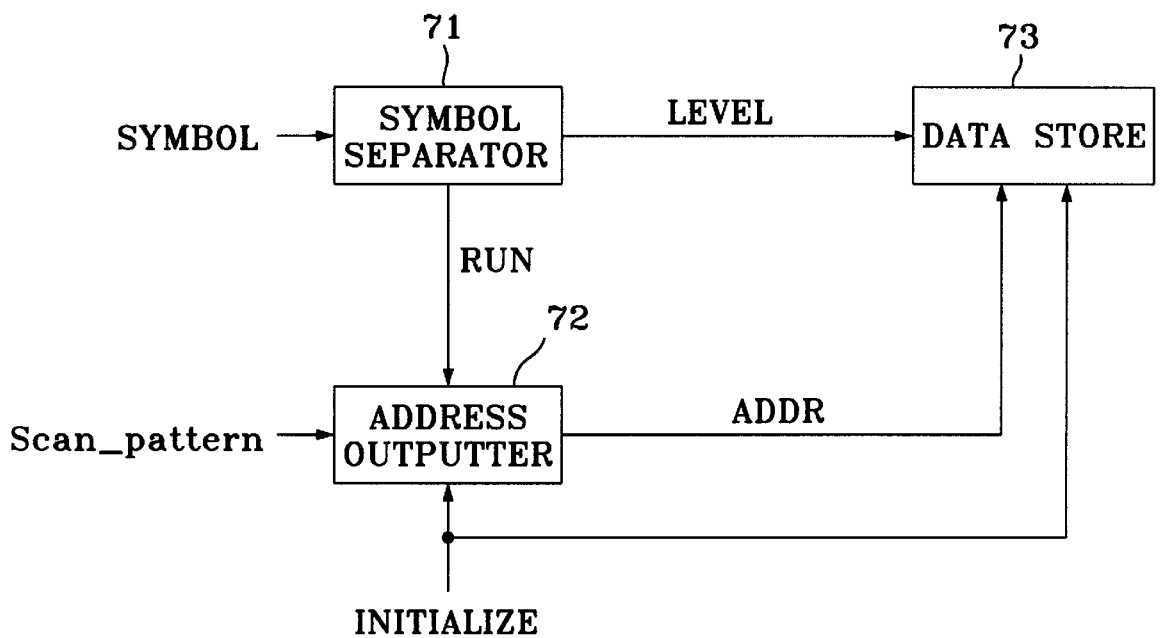
FIG. 7 is a block diagram showing a symbol decoding apparatus according to still another embodiment of the present invention.
Figure 8:
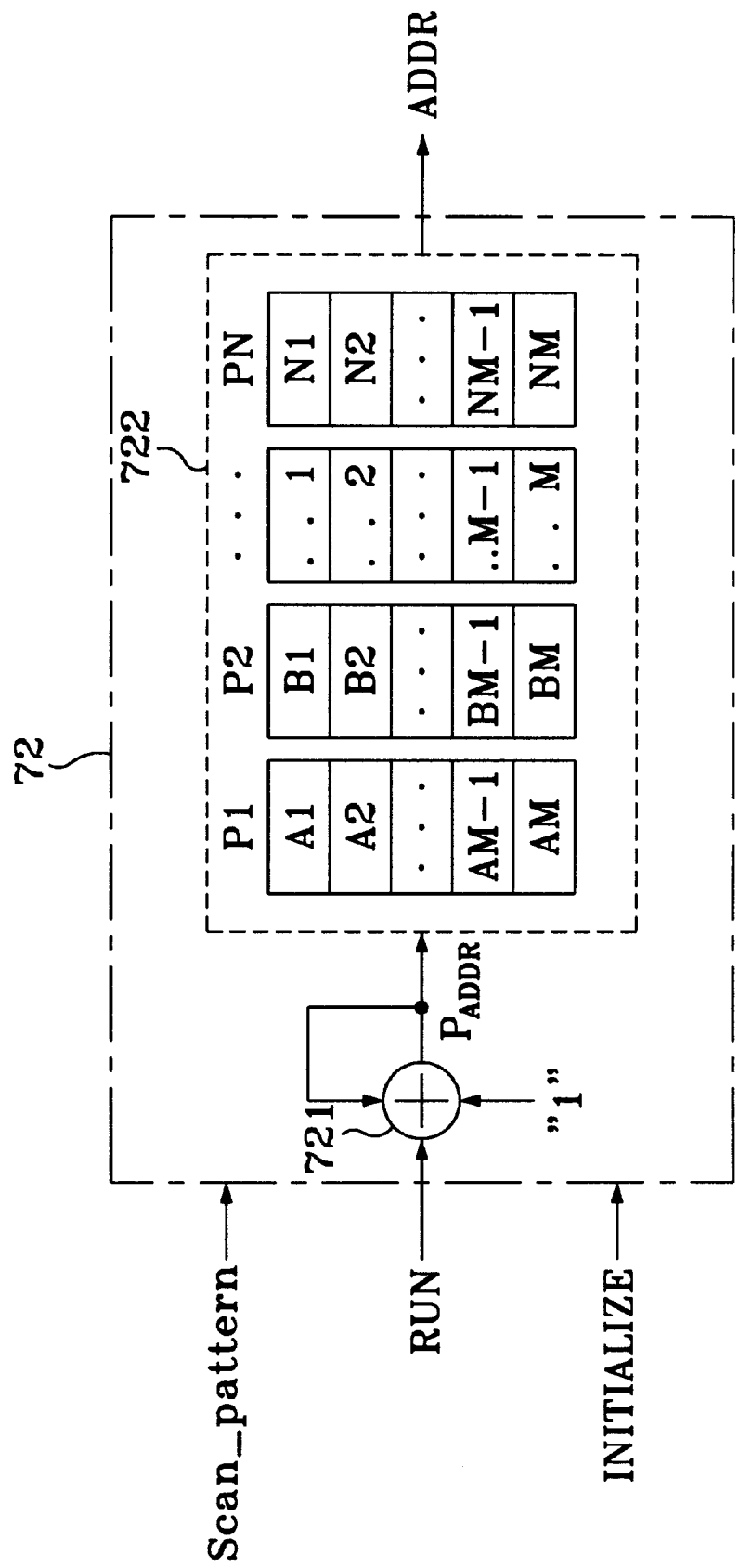
FIG. 8 is a detailed block diagram of an address output unit shown in FIG. 7.

FIG. 7 is a block diagram showing a symbol decoding apparatus according to yet another embodiment of the present invention. A symbol separator 71 shown in FIG. 7 receives a symbol including a pair of run and level, separates the received symbol into run data RUN and level data LEVEL and outputs the separated results. The symbol separator 71 substantially simultaneously outputs the run data RUN and the level data LEVEL obtained by the received symbol to an address outputter 72 and the data store 73, respectively. The address outputter 72 receives scan pattern data Scan_pattern and an initialization signal INITIALIZE as in the address outputter 52 shown in FIG. 5, and generates a scan address ADDR. The address outputter 72, the internal configuration of which is shown in FIG. 8, includes an adder 721 for adding the run data RUN, a predetermined value of "1" and an address pointer $P_{ADDR}$ to be fed back, and an address table 722 for receiving the address pointer being an added result of the adder 721 and outputting a scan address ADDR. The address table 722 includes tables P1 through PN, each table storing the scan addresses corresponding to a scan pattern, by the number of scan patterns used for the run-level encoding in an encoding apparatus. The tables P1 through PN store the scan addresses in sequence with a scan sequence determined by a corresponding scan pattern. In the case where the table P1 stores the scan addresses involved with the zigzag scan pattern shown in FIG. 3A, a scan address corresponding to the figure "3" shown in FIG. 3A is stored in a storage location A3. Therefore, in view of the address offset described with reference to FIG. 4, the value of the address offset stored in a storage location A2 becomes "8." The data store 73 resets all storage contents as "0" according to the initialization signal INITIALIZE and stores the level data LEVEL received from the symbol separator 71 according to the scan address ADDR generated by the address outputter 72.

As described with reference to FIG. 5, the initialization signal INITIALIZE is applied to the address outputter 72 and the data store 73 from the controller (not shown) before the run-level decoding starts with respect to each block. The address do outputter 72 receiving the initialization signal INITIALIZE initializes the current address pointer $P_{ADDR}$ so that the first scan address of the address table 722 is pointed out. The address outputter 72 also selects one of the tables P1 through PN in the address table 722 in correspondence to the input scan pattern data Scan_pattern, at the same time as or before the initial run data RUN belonging to a particular block is received. The data store 73, receiving the same initialization signal INITIALIZE as supplied to the address outputter 72, resets all storage contents as "0." Initialization of the data store 73 resets all the memory cells constituting the data store 73, either simultaneously or in units of a row. Such an initialization technique is apparent to one skilled in the art in the memory field.

Figure 9:
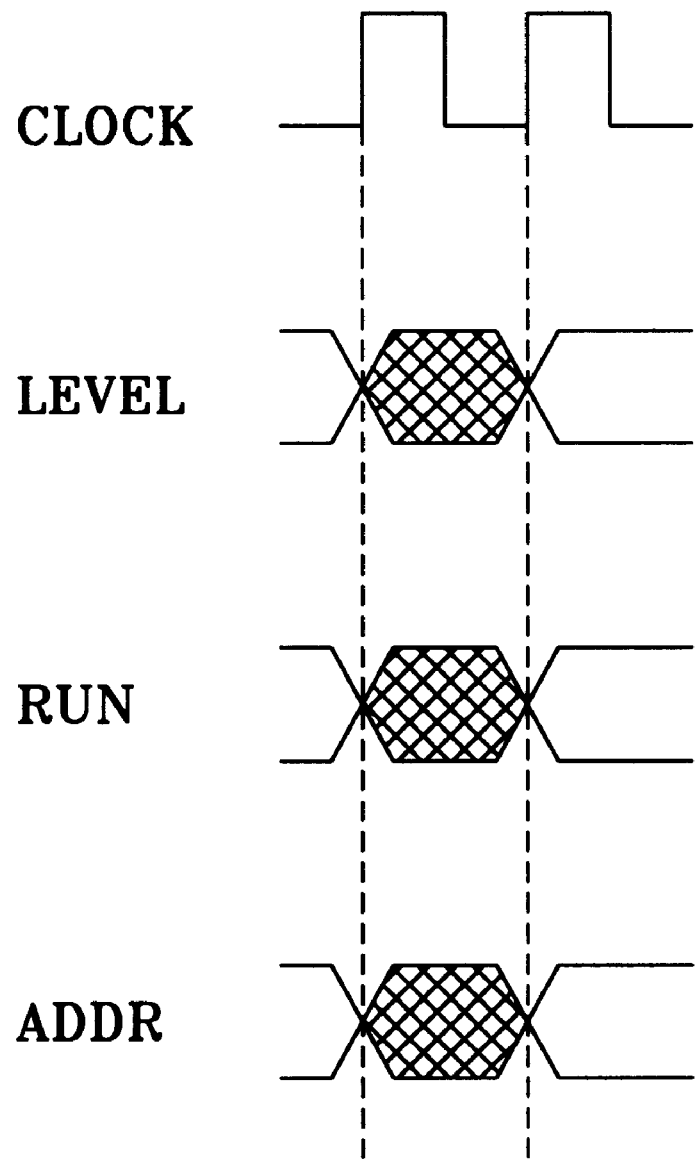
FIG. 9 is a timing diagram for explaining the operation of the FIG. 7 apparatus.

At the state when both the address pointer $P_{ADDR}$ and the data store 73 have been initialized, the symbol separator 71 separates the symbol applied from a variable-length-decoder (not shown) into run data RUN and level data LEVEL, and outputs the separated run data RUN and level data LEVEL in synchronization with one pulse of the clock CLOCK as shown in FIG. 9. For example, when the symbol is constituted by a pair of a run value of "3" and a level value of "5," the symbol separator 71 outputs the run data RUN of "3" and the level data LEVEL of "5" during one pulse period of clock. The run data RUN is input to the address outputter 72 and the level data LEVEL is input to the data store 73.

The adder 721 in the address outputter 72 receiving the run data RUN adds the received run data RUN, a predetermined value of "1" and the feedback address pointer $P_{ADDR}$, and supplies a new address pointer $P_{ADDR}$ being the added result to the address table 722. The address table 722 outputs the scan address ADDR stored at the position designated by the address pointer $P_{ADDR}$ in the selected table, to the data store 73. For example, when the run data RUN of "3" is input under the state where the selected table is P1 and the address pointer $P_{ADDR}$ points out the position A1, the adder 721 adds the value "1" of the feedback address pointer $P_{ADDR}$, the predetermined value of "1" and the run data RUN of "3", and outputs a new address pointer $P_{ADDR}$ of "5." The address table 722 receiving the address pointer $P_{ADDR}$ outputs a scan address ADDR stored in the storage location A5. Therefore, as an example, in the case of the scanning pattern of FIG. 3A, a scan address ADDR which points out a storage location in the data store 73 corresponding to the position indicated by the FIG. "5", is outputted.

The data store 73 stores the level data LEVEL input from the symbol separator 71 in the storage location corresponding to the scan address ADDR output from the address outputter 72. The data store 73 has storage locations corresponding to the data of an 8×8 block size, and outputs the data contained in all storage locations, including the stored data, to an inverse quantizer (not shown) as run-level-decoded data.

Thus, since the FIG. 7 apparatus can generate run data RUN and level data LEVEL corresponding to each symbol and an address ADDR for storing the level data LEVEL for a clock pulse period as shown in FIG. 9, a symbol is decoded during one clock pulse period.

In the above-described embodiments, the data store outputs the stored data to an inverse quantizer. This is a special case that the run-level-encoded data is acquired by performing orthogonal-transform, quantization, variable-lengthen-coding, and run-level-encoding in sequence. As is well-known to a person skilled in the art in the field of run-level-encoding technology, the run data and the level data obtained by run-level-decoding a symbol is stored in the memory in units of a block of an 8×8 size suitable for the inverse orthogonal transform. Therefore, when a quantization processing is not used in the process of obtaining the run-level-encoded symbol, the data stored in the data store can be directly supplied to an inverse orthogonal transformer.

As described above, the present invention run-level-decodes run-level-encoded symbols based on the scan pattern used for run-level-encoding, and stores the run-level-decoded symbols in a form appropriate for use in the downstream unit. Therefore, even in the case that various scan patterns are required for run-level encoding according to the pattern of the image data, the run-level-encoded symbols are transformed and stored in a form appropriate for use in the downstream unit. Also, the present invention provides various methods for storing the run data and the level data obtained from the symbols. Accordingly, the invention provides an apparatus which is very adaptable and easy to fabricate.

While only certain embodiments of the invention have been specifically described herein, it will be apparent that numerous modifications may be made thereto without departing from the spirit and scope of is the invention.

What is claimed is:

1. A data decoding method comprising the steps of:
   receiving a run-level symbol;
   run-level decoding said run-level symbol into at least one zero component and a non-zero component;
   receiving scan pattern data;
   selecting a scan pattern from among a plurality of scan patterns in accordance with said scan pattern data;
   outputting scan addresses corresponding to said selected scan pattern, said scan addresses indicating storage positions for storing said zero component and non-zero component within a memory;
   storing said zero component and said non-zero component of said run-level decoded data in said memory at corresponding positions designated by said scan addresses.

2. The data decoding method according to claim 1, said storing step further comprising:
   receiving each one of said zero components and said non-zero components in a serial manner wherein said storing each of said zero components and non-zero components are performed in response to outputting of each of said scan addresses.

3. The data decoding method according to claim 2, wherein the sequence of outputting of said scan addresses occurs in accordance with the scan sequence of said selected scan pattern.

4. A data decoding method comprising the steps of:
   receiving run-level symbols;
   receiving scan pattern data;
   selecting a scan pattern from among a plurality of scan patterns in accordance with said scan pattern data;
   outputting scan addresses corresponding to said selected scan pattern, said scan addresses indicating storage positions within a memory;
   storing level data corresponding to said received symbols in said memory at corresponding positions designated by said scan addresses.

5. The symbol decoding method according to claim 4, wherein the step of storing comprises the steps of:
   (a) initializing all the stored level data to "0" in response to the initialization signal;
   (b) outputting run data, corresponding to the received symbols, and the level data substantially simultaneously with respect to the received individual symbol;
   (c) responding to the received scan pattern data, the run data in step (b) and the initialization signal, to output the scan address corresponding to the level data output in step (b); and
   (d) storing the level data output in step (b) at a storage position which is designated by the scan address output in step (c).

6. The symbol decoding method according to claim 5, wherein the step (c) comprises the sub-steps of:
   (c1) selecting one from the plurality of scan patterns according to the received scan pattern data;
   (c2) altering an address pointer using the run data output in step (b) and a predetermined value; and
   (c3) designating one among the scan addresses corresponding to the selected scan pattern based on the address pointer altered in step (c2).

7. The symbol decoding method according to claim 6, wherein said predetermined value is for indicating an initial storage location.

8. The symbol decoding method according to claim 6, wherein the step (c) initializes the address pointer whenever the initialization signal is applied.

9. The symbol decoding method according to claim 5, wherein the initialization signal is applied before starting a run-level-decoding with respect to each block of the symbols.

10. The symbol decoding method according to claim 4, wherein the step of storing comprises the steps of:
    (a) initializing all the stored level data as "0" in response to an initialization signal;
    (b) responding to the initialization signal by outputting scan addresses according to a scan sequence of the selected particular scan pattern;
    (c) outputting the level data when a run length, indicated by run data of the received individual symbol, has elapsed; and
    (d) storing the level data output in step (c) according to the corresponding scan address output in step (b).

11. The symbol decoding method according to claim 10, wherein the step (b) comprises the sub-steps of:
    (b1) initializing an address pointer whenever the initialization signal is applied; and
    (b2) altering the address pointer initialized in step (b1) according to the run data of the received individual symbol, and outputting the scan address designated by the altered address pointer.

12. The symbol decoding method according to claim 10, wherein said initialization signal is applied before starting a decoding process of the symbols with respect to each block.

13. A data decoding apparatus comprising:
- a decoder which run-level decodes a received run-level symbol into at least one zero component and a non-zero component;
- an address generator which receives scan pattern data and selects a scan pattern from among a plurality of scan patterns in accordance with said scan pattern data, and outputs scan addresses corresponding to said selected scan pattern, said scan addresses indicating storage positions for storing said zero component and non-zero component; and
- a memory which stores said zero component and said non-zero component of said run-level decoded data at corresponding positions designated by said scan addresses.

14. The data decoding apparatus according to claim 13, wherein said memory receives each one of said zero components and said non-zero components in a serial manner, in synchronization with a respective pulse of an applied clock, and stores each of said zero components and said non-zero components in response to each of said scan addresses output by said address generator.

15. The data decoding apparatus according to claim 14, wherein the sequence in which said address generator outputs the scan addresses occurs in accordance with the scan sequence of a corresponding scan pattern.

16. A data decoding apparatus comprising:
- a decoder which run-level decodes received run-level symbols; and
- storage means for receiving scan pattern data and selecting a scan pattern from among a plurality of scan patterns in accordance with said scan pattern data, generating scan addresses corresponding to said selected scan pattern, said scan addresses indicating storage positions, and for storing level data corresponding to said received symbols at corresponding positions designated by said scan addresses.

17. The data decoding apparatus according to claim 16, wherein said decoder outputs the level data when a number of pulses, the number corresponding to run data of a received individual symbol, have been output by a clock.

18. The data decoding apparatus according to claim 17, wherein said data storage means comprises:
- an address outputter for storing scan addresses according to a scan sequence of each of the plurality of scan patterns and outputting the scan addresses determined by the selected scan pattern and run data output from decoder;
- a data store for resetting all stored contents to "0" according to an applied initialization signal, and storing the level data at storage positions designated by the scan addresses output from said address outputter; and
- an enabling unit for receiving the clock and run data output from said decoder; and activating a storage operation of said data store by generating an enable signal, the enable signal being generated when the number of pulses output by the clock corresponds to the run data of the received individual symbol.

19. The data decoding apparatus according to claim 18, wherein said address outputter stores the scan addresses corresponding to each of the plurality of scan patterns in the form of a table according to a scan sequence corresponding to each scan pattern.

20. The data decoding apparatus according to claim 19, wherein said address outputter designates the scan addresses stored in the form of a table via an address pointer, and initializes the address pointer in order to point out a scan address having an initial scan sequence whenever an initialization signal is applied.

21. The data apparatus according to claim 18, wherein said initialization signal is applied before starting a run-level-decoding of each block data.

22. The data decoding apparatus according to claim 16, wherein said decoder outputs run data and the level data separated from a received individual symbol substantially simultaneously.

23. The data decoding apparatus according to claim 22, wherein said data storage means comprises:
- an address outputter for storing scan addresses according to each scan sequence of the plurality of scan patterns, altering an address pointer using the run data output from said symbol separator decoder, and outputting a scan address designated by the altered address pointer; and
- a data store for resetting all the stored contents according to an applied initialization signal, and storing the level data output from said decoder at the storage position designated by the scan address output from said address outputter.

24. The data decoding apparatus according to claim 24, wherein said address outputter comprises:
- an address table for storing the scan addresses corresponding to a plurality of scan patterns in the form of a plurality of tables according to a scan sequence corresponding to each scan pattern; and
- an adder for adding a current address pointer, the run data supplied from said symbol separator and a predetermined value and altering the current address pointer.

25. The data decoding apparatus according to claim 24, wherein said address outputter initializes the current address pointer whenever the initialization signal is applied.

26. The data decoding apparatus according to claim 24, wherein said initialization signal is applied before starting decoding in units of a block.

27. A data decoding method comprising the steps of:
- receiving data comprising at least one zero component and a non-zero component;
- receiving scan pattern data;
- selecting a scan pattern among a plurality of scan patterns in accordance with said scan pattern data;
- outputting scan addresses corresponding to said selected scan pattern, said scan addresses indicating storage positions for storing said zero component and non-zero component within a memory; and
- storing said zero component and said non-zero component in said memory at corresponding positions designated by said scan addresses.

28. The data decoding method according to claim 27, said storing step further comprising:
- receiving each one of said zero components and said non-zero components in a serial manner, wherein said storing each of said zero components and non-zero components are performed in response to outputting of each of said scan addresses.

29. The data decoding method according to claim 28, wherein said data comprises one-dimensional scanned image data.

30. A data decoding apparatus, comprising:

means for receiving data comprising at least one zero component and a non-zero component;

means for receiving scan pattern data;

means for selecting a scan pattern among a plurality of scan patterns in accordance with said scan pattern data;

means for outputting scan addresses corresponding to said selected scan pattern, said scan addresses indicating storage positions for storing said zero component and non-zero component within a memory; and means for storing said zero component and said non-zero component in said memory at corresponding positions designated by said scan addresses.

31. The data decoding apparatus according to claim 30, said means for storing further comprising:

means for receiving each one of said zero components and said non-zero components in a serial manner, wherein each of said zero components and non-zero components is stored in response to outputting of each of said scan addresses.

32. The data decoding apparatus according to claim 31, wherein said data comprises one-dimensional scanned image data.

33. A data decoding apparatus, comprising:

a decoder which receives data including at least one zero component and a non-zero component;

an address generator which receives scan pattern data and selects a scan pattern among a plurality of scan patterns in accordance with said scan pattern data and outputs scan addresses corresponding to said selected scan pattern, said scan addresses indicating storage positions for storing said zero component and non-zero component; and a memory which stores said zero component and said non-zero component at corresponding positions designated by said scan addresses.

34. The data decoding apparatus according to claim 33, wherein said memory receives each one of said zero components and said non-zero components in a serial manner, and stores each of said zero components and non-zero components in response to each of said scan addresses output by said address generator.

35. The data decoding apparatus according to claim 34, wherein said data comprises one-dimensional scanned image data.

* * * * *